(12) United States Patent
Wang et al.

(10) Patent No.: US 11,707,834 B2
(45) Date of Patent: Jul. 25, 2023

(54) SUBSTRATE TRANSFER DEVICE

(71) Applicant: BOE Technology Group Co., Ltd., Beijing (CN)

(72) Inventors: Chengfei Wang, Beijing (CN); Junwei Yan, Beijing (CN); Guangcai Yuan, Beijing (CN); Shaodong Sun, Beijing (CN); Guocai Zhang, Beijing (CN); Shihao Dong, Beijing (CN); Pengcheng Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/516,269

(22) Filed: Nov. 1, 2021

(65) Prior Publication Data
US 2022/0168888 A1 Jun. 2, 2022

(30) Foreign Application Priority Data
Nov. 30, 2020 (CN) .......................... 202022841195.6

(51) Int. Cl.
*B25J 9/02* (2006.01)
*B25J 13/08* (2006.01)
*B25J 15/02* (2006.01)
*C25D 17/06* (2006.01)

(52) U.S. Cl.
CPC ............. *B25J 9/026* (2013.01); *B25J 13/088* (2013.01); *B25J 15/0253* (2013.01); *C25D 17/06* (2013.01)

(58) Field of Classification Search
CPC ...... B25J 9/026; B25J 13/088; B25J 15/0253; C25D 17/06; H01L 21/6732; H01L 21/67326; H01L 21/6734; H01L 21/67346; H01L 21/67712; H01L 21/68735
See application file for complete search history.

(56) References Cited

U.S. PATENT DOCUMENTS

| 4,403,897 | A | * | 9/1983 | Willis | .................. E21B 19/155 414/745.2 |
| 6,241,079 | B1 | * | 6/2001 | Weber | .................. G11B 23/00 198/817 |
| 9,612,191 | B2 | * | 4/2017 | Yang | ...................... G01N 21/95 |
| 2010/0003768 | A1 | * | 1/2010 | Barnes | .............. H01L 21/67346 204/192.12 |

FOREIGN PATENT DOCUMENTS

KR 101746605 B1 * 6/2017 ......... H01L 21/6773

* cited by examiner

*Primary Examiner* — Saul Rodriguez
*Assistant Examiner* — Brendan P Tighe
(74) *Attorney, Agent, or Firm* — IPro, PLLC

(57) ABSTRACT

The present application relates to a substrate transfer device, comprising a horizontally arranged cross beam, and support beams longitudinally arranged at two ends of the cross beam, wherein a substrate carrier is suspended on the cross beam, the substrate carrier is located between the two support beams, and the substrate carrier is parallel to a plane where the two support beams are located, the substrate carrier comprises two side walls oppositely arranged in a horizontal direction, and each of the support beams is provided with an auxiliary clamping structure for clamping the substrate carrier during transferring of the substrate carrier.

7 Claims, 3 Drawing Sheets

SUBSTRATE TRANSFER DEVICE

CROSS-REFERENCE TO RELATED APPLICATIONS

This application claims priority to Chinese Patent Application No. 202022841195.6 filed in China on Nov. 30, 2020, the entire contents of which are hereby incorporated by reference.

TECHNICAL FIELD

The present application relates to the technical field of display product manufacturing, and more particularly to a substrate transfer device.

BACKGROUND

In order to reduce power consumption and avoid overheating of the backlight caused by long lighting, it is necessary to reduce the impedance of the routing channel as much as possible. At present, reducing the wiring impedance is usually achieved by thickening the conductive layer. With regard to the current process, there are two schemes, namely magnetron sputtering and electrochemical deposition, wherein the electrochemical deposition process is a low-cost chemical film-forming method, and can deposit a metal with a thickness of 2-20 μm, so as to obtain a lower resistance; and the electrodeposition has the advantages of high efficiency, low stress and low risk, etc.

However, in the large-size electrochemical deposition equipment, the substrate carrier carried by the substrate transfer device is operated in each process tank to perform electrochemical deposition process production, and the speed of the substrate carrier carried by the substrate transfer device should reach 2000 mm/s according to the capacity requirement; a clamping mechanism is provided on the upper part of the substrate carrier, and during starting, stopping and travelling, the lower part of the substrate carrier will be deflected due to inertia, and the swing will affect the reliability of the mechanism and the situation of meeting the capacity.

SUMMARY

The technical solution adopted in the embodiments of the present application is as follows: a substrate transfer device comprising a horizontally arranged cross beam, and support beams longitudinally arranged at two ends of the cross beam, wherein a substrate carrier is suspended on the cross beam, the substrate carrier is located between the two support beams, and the substrate carrier is parallel to a plane where the two support beams are located, the substrate carrier comprises two side walls oppositely arranged in a horizontal direction, and each of the support beams is provided with an auxiliary clamping structure for clamping the substrate carrier during transferring of the substrate carrier.

Optionally, the auxiliary clamping structure comprises a drive connection portion provided on the support beam, and a connection arm connected to the drive connection portion, wherein a clamping portion is provided at one end of the connection arm away from the drive connection portion, and the drive connection portion is used for controlling an extension direction of the connection arm to be parallel to an extension direction of the support beam, or,
an extension direction of the connection arm to be perpendicular to an extension direction of the support beam to allow the clamping portion to clamp the substrate carrier.

Optionally, the drive connection portion comprises a first telescopic cylinder arranged in parallel with the extension direction of the support beam, and a transmission rod connected to one end of the first telescopic cylinder via a first rotary shaft 51, the transmission rod being in transmission connection with one end of the connection arm via a second rotary shaft 52;

when the extension direction of the connection arm is perpendicular to the extension direction of the support beam, the extension direction of the transmission rod is perpendicular to a movement direction of the first telescopic cylinder; and when the first telescopic cylinder extends, under the action of the transmission rod, the extension direction of the connection arm changes to be parallel to the extension direction of the support beam, and when the first telescopic cylinder retracts, under the action of the transmission rod, the extension direction of the connection arm changes to be perpendicular to the extension direction of the support beam.

Optionally, the drive connection portion further comprises guard plates provided on opposite sides of the transmission rod in a direction perpendicular to the extension direction of the support beams, the guard plates being fixed to the support beam and extending toward a direction approaching the substrate carrier, and both ends of the second rotary shaft being fixed to one ends of the guard plates away from the support beams.

Optionally, the clamping portion comprises:

a receiving groove, the bottom of the receiving groove being connected to the connection arm;

a second telescopic cylinder received in the receiving groove, one end of the second telescopic cylinder being fixed at the bottom of the receiving groove, and an extension direction of the second telescopic cylinder being the same as the extension direction of the transmission rod; and two clamping assemblies arranged opposite to each other, each of the clamping assemblies comprising at least one clamping connecting rod having, in an arrangement direction thereof, a head end connected to the second telescopic cylinder and a tail end as a free end;

when the second telescopic cylinder extends, the tail end moves away from the receiving groove, and a space between the tail ends of the two clamping assemblies increases as the tail end moves;

when the second telescopic cylinder retracts, the tail end moves in a direction approaching the receiving groove, and a space between the tail ends of the two clamping assemblies decreases as the tail end moves.

Optionally, a first sensor for detecting a telescopic state of the first telescopic cylinder is provided on the first telescopic cylinder, and a second sensor for detecting a telescopic state of the second telescopic cylinder is provided on the second telescopic cylinder.

Optionally, the substrate carrier has a center line parallel to an extension direction of the cross beam, and the auxiliary clamping structure is configured to clamp a part of the substrate carrier remote from the cross beam from the center line.

Optionally, each of the support beams is provided with a receiving groove on a side near the substrate carrier for receiving the auxiliary clamping structure.

Optionally, the substrate transfer device further comprises a frame on which a guide rail is provided, a bottom of each of the support beams is provided with a roller, and the

DETAILED DESCRIPTION

Figure 1:
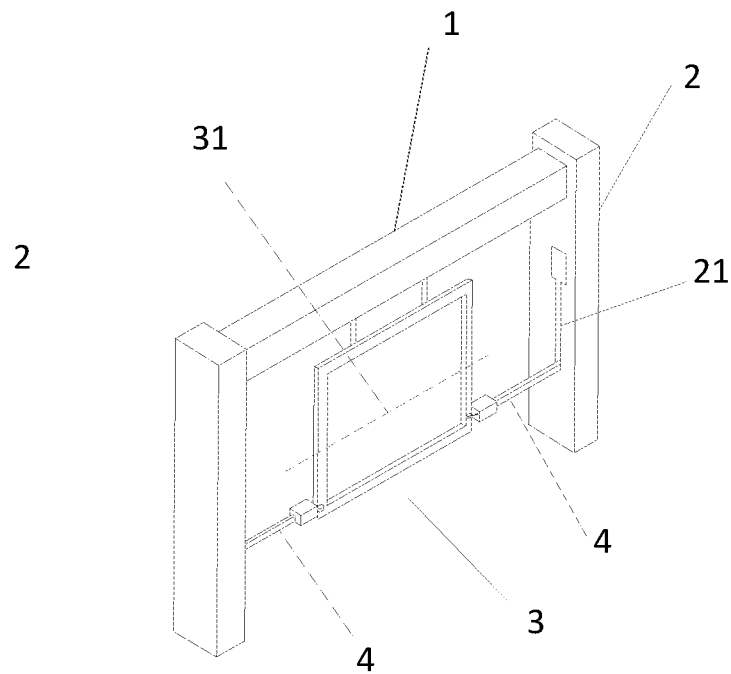
FIG. 1 shows a schematic view of a part of a substrate transfer device according to an embodiment of the present application.

In order to make the objects, technical solutions and advantages of the embodiments of the present application clearer, the technical solutions of the embodiments of the present application will be clearly and completely described with reference to the accompanying drawings of the embodiments of the present application. It is to be understood that the described embodiments are part, but not all, of the present application. Based on the described embodiments of the present application, all other embodiments obtained by a person skilled in the art fall within the scope of protection of the present application.

In the description of the present application, it should be noted that the directional or positional relationships indicated by the terms "center", "upper", "lower", "left", "right", "vertical", "horizontal", "inner", "outer", and the like, are based on the directional or positional relationships shown in the drawings, merely to facilitate and simplify the description of the present application, and do not indicate or imply that the referenced devices or elements must have a particular orientation, be constructed and operated in a particular orientation, and thus should not be construed as limiting the present application. Furthermore, the terms "first", "second", and "third" are used for descriptive purposes only and are not to be construed as indicating or implying relative importance.

Since the weight of the substrate carrier is as high as 300 Kg, in the high-speed operation of 2000 mm/s, starting, operating and stopping must cause the substrate carrier to swing in the air; in the process of process production, it is necessary to passively wait for the swing to approach to stop (the swing amplitude is less than 2 mm) before placing the substrate carrier into the process tank body, which seriously affects the productivity of the equipment; at the same time, in the swing process, the glass substrate is subject to the stress of the substrate carrier, which is easy to generate debris; in the swing process, the substrate carrier has a great impact on the reliability of the running mechanism of the substrate transfer device, which accelerates the aging of the running track. In the swing process of the substrate carrier, the reliability of the gripping mechanism of the substrate carrier is greatly affected, which reduces the service life of the gripping mechanism.

As shown in FIGS. 1-5, the present embodiment provides a substrate transfer device, comprising a cross beam 1 arranged horizontally, and support beams 2 arranged longitudinally at two ends of the cross beam 1, wherein a substrate carrier 3 is suspended on the cross beam 1, the substrate carrier 3 is located between the two support beams 2, and the substrate carrier 3 is parallel to a plane where the two support beams 2 are located, the substrate carrier 3 comprises two side walls arranged oppositely in a horizontal direction, and an auxiliary clamping structure 4 is arranged on each of the support beams 2; the auxiliary clamping structure 4 is used for clamping the substrate carrier 3 during transferring of the substrate carrier.

By means of the arrangement of the auxiliary clamping structure 4, the swing amplitude of the substrate carrier 3 can be controlled within 2 mm, which meets the tolerance of the substrate transfer device and the substrate carrier 3 gripping mechanism in normal operation, so as to minimize the damage caused to the mechanism by the substrate swing and prolong the service life. It can satisfy the high-speed smooth operation of the substrate transfer device under heavy load, effectively guarantee the capacity and reduce the debris rate.

With reference to FIG. 1, in this embodiment, as an example, the bearing surface of the substrate carrier 3 is arranged perpendicular to a horizontal plane, the side wall is divided into a first portion close to the cross beam 1 and a second portion away from the cross beam 1 in a vertical direction, and the auxiliary clamping structure 4 is used for clamping to the second portion of the side wall, that is to say, the substrate carrier 3 has a centre line 31 parallel to the extension direction of the cross beam 1, and the auxiliary clamping structure clamps to a portion of the substrate carrier 3 away from the cross beam 1 of the center line 31, with reference to FIG. 1.

As illustrated in the present embodiment, the auxiliary clamping structures 4 are symmetrically arranged on both sides of the substrate carrier 3 to ensure the uniformity of the force applied to the substrate carrier 3.

As illustrated in this embodiment, the auxiliary clamping structure 4 is clamped to a corresponding side wall of the substrate carrier 3, away from one end of the cross beam 1, thereby effectively reducing the swing amplitude of the substrate carrier 3. By providing the auxiliary clamping structure, the swing amplitude of the substrate carrier is reduced, the damage caused to the substrate transfer device by the substrate carrier swing is reduced, and the service life is extended.

Figure 2:
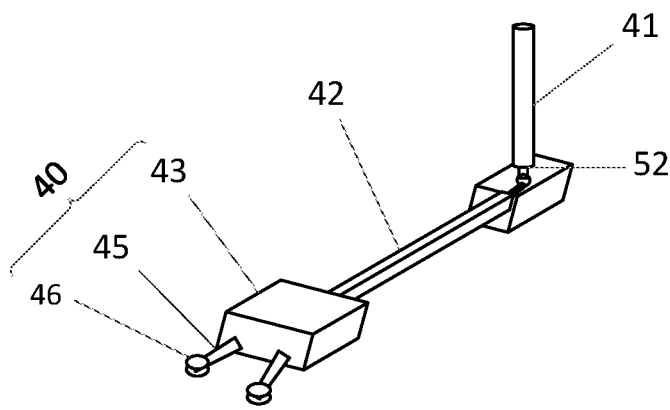
FIG. 2 shows a schematic view of an auxiliary clamping structure according to an embodiment of the present application.
Figure 3:
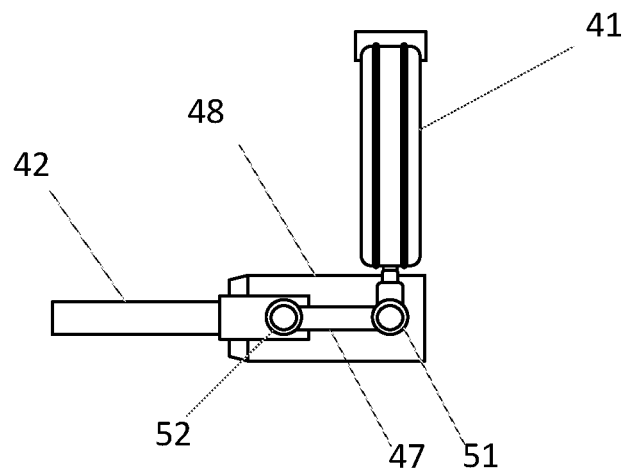
FIG. 3 shows a schematic view of a drive connection portion according to an embodiment of the present application.

Referring to FIGS. 2 and 3, the auxiliary clamping structure 4 in the present embodiment exemplarily includes a drive connection portion provided on the support beam 2, and a connection arm 42 connected to the drive connection portion, the connection arm 42 being provided with a clamping portion 40 at one end remote from the drive connection portion, the drive connection portion being used for controlling The extension direction of the connection arm 42 is parallel to the extension direction of the support beam 2, or The extension direction of the connection arm 42 is perpendicular to the extension direction of the support beam 2 so that the clamping portion 40 can clamp the substrate carrier 3.

In the present embodiment, a state in which the extension direction of the connection arm 42 is parallel to the extension direction of the support beam 2 is defined as a first state, a state in which the extension direction of the connection arm 42 is perpendicular to the extension direction of the support beam 2 is defined as a second state, and the drive connection portion is used to control the transition of the connection wall 42 between the first state and the second state.

The drive connection portion can control the connection arm 42 to perform a 90-degree rotary motion; when it is not necessary to clamp the substrate carrier 3, the drive connection portion controls the connection wall to move parallel to the extension direction of the support beam 2, i.e., the connection arm 42 is in the first state; when it is necessary to clamp the substrate carrier 3, the drive connection portion controls the connection wall to move perpendicular to the extension direction of the support beam 2, i.e., the connection arm 42 is in the second state, so as to avoid affecting other structures when it is not necessary to perform a clamping action.

Exemplarily in the present embodiment, each of the support beams 2 is provided with a receiving groove 21 on a side thereof adjacent to the substrate carrier 3 for receiving the auxiliary holding structure 4 in the first state.

The arrangement of the receiving groove 21 enables the auxiliary clamping structure 4 to be received in the receiving groove 21 when the substrate carrier 3 is unloaded, i.e., when there is no need to clamp the substrate carrier 3, so as to avoid interference with other structures.

As exemplary in the present embodiment, the drive connection portion comprises a first telescopic cylinder 41 arranged parallel to the extension direction of the support beam 2, and a transmission rod 47 connected to one end of the first telescopic cylinder 41 via a first rotary shaft 51, and the transmission rod 47 is in transmission connection with one end of the connection arm 42 via a second rotary shaft 52;

In the second state, the extension direction of the transmission rod 47 is perpendicular to the movement direction of the first telescopic cylinder 41;

the first telescopic cylinder 41 is extended, and under the action of the transmission rod 47, the connection arm 42 is converted from the second state to the first state, and the first telescopic cylinder 41 is retracted, and under the action of the transmission rod 47, the connection arm 42 is converted from the first state to the second state.

As illustrated in this embodiment, the drive connection portion further includes guard plates 48 provided on opposite sides of the transmission rod 47 in a direction perpendicular to the extension direction of the support beam 2, the guard plates 48 being fixed to the support beam 2 and extending in a direction close to the substrate carrier 3, and both ends of the second rotation shaft being fixed to one end of the guard plates 48 away from the support beam 2.

The arrangement of the guard plates 48 serves to protect the transmission rod 47, and the two ends of the second rotary shaft 52 are located between two of the guard plates 48 and are fixed to one end of the guard plates 48 away from the support beam 2, defining the distance between the connection arm 42 and the support beam 2 in the second state, facilitating the transition of the connection arm 42 between the first state and the second state, and avoiding interference between the connection arm 42 and the support beam 2.

As illustrated in this embodiment, the clamping portion 40 includes:

a receiving groove 43, the bottom of the receiving groove 43 being connected to the connection arm 42;

a second telescopic cylinder 49 received in the receiving groove 43, one end of the second telescopic cylinder 49 being fixed at the bottom of the receiving groove 43, and the extension direction of the second telescopic cylinder 49 being the same as the extension direction of the transmission rod 47;

two clamping assemblies arranged opposite to each other, wherein each of the clamping assemblies comprises at least one clamping connecting rod 45, at least one of the clamping connecting rods 45 comprises a head end and a tail end arranged along an arrangement direction thereof, the head end is connected to the second telescopic cylinder 49, and the tail end is a free end;

when the second telescopic cylinder 49 extends, the tail end moves away from the receiving groove 43, and the space between the tail ends of the two clamping assemblies increases as the tail end moves;

when the second telescopic cylinder 49 retracts, the tail end moves in a direction close to the receiving groove 43, and the space between the tail ends of the two clamping assemblies decreases as the tail end moves.

Figure 4:
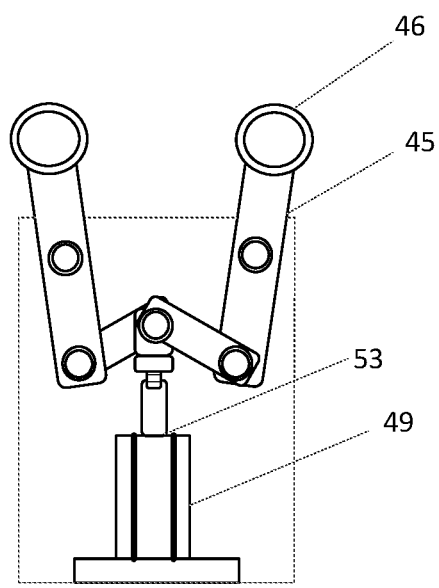
FIG. 4 shows a schematic view showing the structure of a clamping portion according to an embodiment of the present application.

With reference to FIG. 4, the second telescopic cylinder 49 extends, the two clamping assemblies move away from each other, so that the space between the ends of the two clamping assemblies increases as the ends move, the second telescopic cylinder 49 contracts, so that the two clamping assemblies move towards each other, the space between the ends of the two clamping assemblies decreases as the ends move, and at least part of the clamping assemblies are received in the receiving groove 43, so that when the connection arm 42 is converted from the first state to the second state, the clamping assembly collides with the substrate carrier 3.

In the present embodiment, two of the clamping assemblies are symmetrically arranged, and the number of the clamping links 45 contained in each of the clamping assemblies can be set according to practical requirements, and in the present embodiment, each of the clamping assemblies comprises three of the clamping links 45, but this is not limiting.

Exemplarily in this embodiment, the first telescopic cylinder 41 is provided with a first sensor 53 for detecting the telescopic state of the first telescopic cylinder 41, and the second telescopic cylinder 49 is provided with a second sensor 54 for detecting the telescopic state of the second telescopic cylinder 49.

The arrangement of the first sensor 53 is used for detecting the telescopic state of the first telescopic cylinder 41, and the arrangement of the second sensor 54 is used for detecting the telescopic state of the second telescopic cylinder 49, so as to ensure that after one telescopic cylinder of the first telescopic cylinder 41 and the second telescopic cylinder 49 is telescoped into place, the other telescopic cylinder can start to perform the next action. Specifically, when the first telescopic cylinder 41 is contracted and the connection arm 42 is converted into the second state, the second telescopic cylinder 49 in the clamping portion 40 is extended so that the clamping assembly clamps the substrate carrier 3. The second telescopic cylinder 49 is contracted, so that the space between the two clamping assemblies is reduced (namely, closed), and moves in a direction close to the receiving groove 43, and at least part of the clamping assemblies are received in the receiving groove 43 (in one embodiment, the clamping assemblies can be completely received in the receiving groove 43); at this time, the first telescopic cylinder 41 extends, so that the connection arm 42 is converted into the first state; the first sensor 53 and the second sensor 54 define the start time of movement of the first telescopic cylinder 41 and the second telescopic cylinder 49, avoiding interference of the auxiliary clamping structure 4 during movement.

As an example of the present embodiment, a roller 46 is provided at an end of the clamping link 45, and the substrate carrier 3 is clamped by the roller 46, so that damage to the substrate carrier 3 by the clamping link 45 is avoided.

As illustrated in this embodiment, the transmission rod 47, the first rotary shaft 51, the second rotary shaft 52, and the clamping link 45 are made of square steel, which improves the connection stability of the auxiliary support structure.

The present application also provides a substrate transfer device, wherein the substrate transfer device further comprises a frame 10, and the above-mentioned substrate transfer device is movably arranged on the frame 10.

Figure 5:
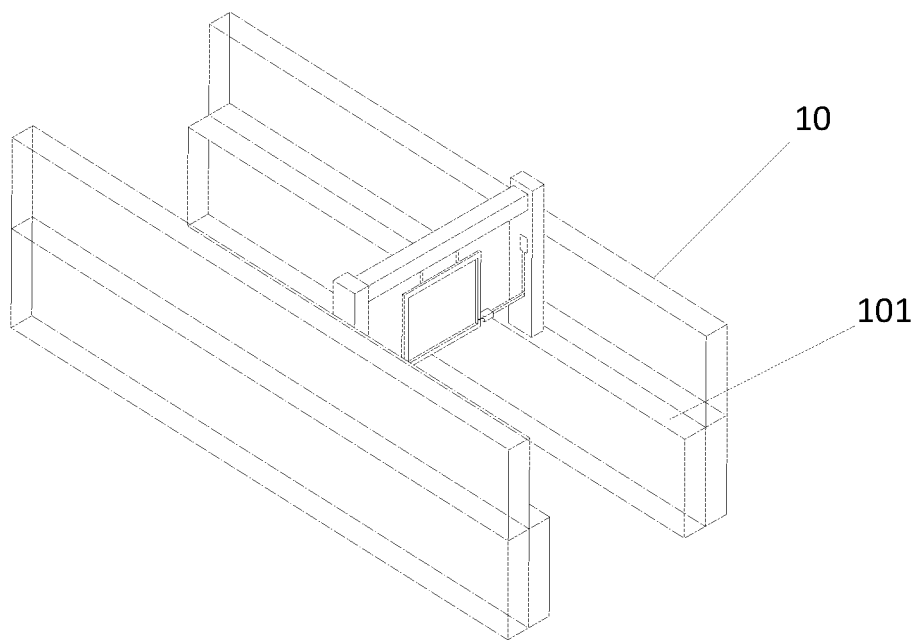
FIG. 5 shows a schematic diagram of a part of a substrate transfer device according to an embodiment of the present application.

Referring to FIG. 5, the bottom of the support beam 2 is provided with a roller, the frame 10 is provided with a rail 101, the support beam 2 is slidably connected to the rail 101 by the roller, and the support beam 2 moves on the guide rail 101 by the roller to transfer the substrate carrier 3 between the respective process tanks.

While the foregoing is directed to the preferred embodiments of the present invention, it will be understood by those skilled in the art that various changes in form and details may be made therein without departing from the spirit and scope of the invention as defined by the appended claims.

What is claimed is:

1. A substrate transfer device for transferring a substrate carrier, comprising a horizontally arranged cross beam, and support beams longitudinally arranged at two ends of the cross beam, wherein a substrate carrier is suspended on the cross beam, the substrate carrier is located between the two support beams, and the substrate carrier is parallel to a plane where the two support beams are located, the substrate carrier comprises two side walls oppositely arranged in a horizontal direction, and each of the support beams is provided with an auxiliary clamping structure for clamping the substrate carrier during transferring of the substrate carrier;

wherein the auxiliary clamping structure comprises a drive connection portion provided on the support beam, and a connection arm connected to the drive connection portion, wherein a clamping portion is provided at one end of the connection arm away from the drive connection portion, and the drive connection portion is used for controlling an extension direction of the connection arm to be parallel to an extension direction of the support beam, or, controlling an extension direction of the connection arm to be perpendicular to an extension direction of the support beam to allow the clamping portion to clamp the substrate carrier;

wherein the drive connection portion comprises a first telescopic cylinder arranged in parallel with the extension direction of the support beam, and a transmission rod connected to one end of the first telescopic cylinder via a first rotary shaft, the transmission rod being in transmission connection with one end of the connection arm via a second rotary shaft;

when the extension direction of the connection arm is perpendicular to the extension direction of the support beam, the extension direction of the transmission rod is perpendicular to a movement direction of the first telescopic cylinder; and when the first telescopic cylinder extends, under the action of the transmission rod, the extension direction of the connection arm changes to be parallel to the extension direction of the support beam, and when the first telescopic cylinder retracts, under the action of the transmission rod, the extension direction of the connection arm changes to be perpendicular to the extension direction of the support beam.

2. The substrate transfer device according to claim 1, wherein the drive connection portion further comprises guard plates provided on opposite sides of the transmission rod in a direction perpendicular to the extension direction of the support beams, the guard plates being fixed to the support beam and extending toward a direction approaching the substrate carrier, and both ends of the second rotary shaft being fixed to one ends of the guard plates away from the support beams.

3. The substrate transfer device according to claim 1, wherein the clamping portion comprises:

a receiving groove, the bottom of the receiving groove being connected to the connection arm;

a second telescopic cylinder received in the receiving groove, one end of the second telescopic cylinder being fixed at the bottom of the receiving groove, and an extension direction of the second telescopic cylinder being the same as the extension direction of the transmission rod; and two clamping assemblies arranged opposite to each other, each of the clamping assemblies comprising at least one clamping connecting rod having, in an arrangement direction thereof, a head end connected to the second telescopic cylinder and a tail end as a free end;

when the second telescopic cylinder extends, the tail end moves away from the receiving groove, and a space between the tail ends of the two clamping assemblies increases as the tail end moves;

when the second telescopic cylinder retracts, the tail end moves in a direction approaching the receiving groove, and a space between the tail ends of the two clamping assemblies decreases as the tail end moves.

4. The substrate transfer device according to claim 3, wherein a first sensor for detecting a telescopic state of the first telescopic cylinder is provided on the first telescopic cylinder, and a second sensor for detecting a telescopic state of the second telescopic cylinder is provided on the second telescopic cylinder.

5. The substrate transfer device according to claim 1, wherein the substrate carrier has a center line parallel to an extension direction of the cross beam, and the auxiliary clamping structure is configured to clamp a part of the substrate carrier remote from the cross beam from the center line.

6. The substrate transport device according to claim 1, wherein each of the support beams is provided with a receiving groove on a side near the substrate carrier for receiving the auxiliary clamping structure.

7. The substrate transfer device according to claim 1, further comprising a frame on which a guide rail is provided, a bottom of each of the support beams is provided with a roller, and the support beam is moved on the guide rail by the roller to transfer the substrate carrier between the respective process tanks.

\* \* \* \* \*